(12) United States Patent
Sundararajan

(10) Patent No.: US 7,813,912 B1
(45) Date of Patent: Oct. 12, 2010

(54) PROFILING A HARDWARE SYSTEM GENERATED BY COMPILING A HIGH LEVEL LANGUAGE ONTO A PROGRAMMABLE LOGIC DEVICE

(75) Inventor: Prasanna Sundararajan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 588 days.

(21) Appl. No.: 11/706,743

(22) Filed: Feb. 14, 2007

(51) Int. Cl.
G06F 9/45 (2006.01)
G06F 17/50 (2006.01)

(52) U.S. Cl. .................. 703/22; 717/136; 717/140; 716/3

(58) Field of Classification Search ............. 703/13, 703/14, 23; 717/134, 136, 137, 138, 140; 716/3, 16
See application file for complete search history.

(56) References Cited

U.S. PATENT DOCUMENTS

| | | | |
|---|---|---|---|
| 5,937,202 A * | 8/1999 | Crosetto | 712/19 |
| 6,389,379 B1 * | 5/2002 | Lin et al. | 703/14 |
| 2002/0059054 A1 * | 5/2002 | Bade et al. | 703/20 |
| 2004/0143801 A1 * | 7/2004 | Waters et al. | 716/3 |
| 2006/0031791 A1 * | 2/2006 | Moona et al. | 716/3 |
| 2007/0061124 A1 * | 3/2007 | Van Huben et al. | 703/16 |

* cited by examiner

*Primary Examiner*—Paul L Rodriguez
*Assistant Examiner*—Andre Pierre Louis
(74) *Attorney, Agent, or Firm*—Kevin T. Cuenot; LeRoy D. Maunu; Lois D. Cartier

(57) ABSTRACT

A method of profiling a hardware system can include compiling a high level language program into an assembly language representation of the hardware system and translating instructions of the assembly language representation of the hardware system into a plurality of executable, software models. The models can be implemented using a high level modeling language for use with cycle accurate emulation. The method also can include instrumenting at least one of the plurality of models with code that, when executed, provides operating state information relating to the model as output and indicating expected behavior of the circuit by executing the models in an emulation environment.

20 Claims, 13 Drawing Sheets

```
int result;
if (a==b)
        result=dosomething();
else
        result=somethingelse();
```

```
reg     tmp,res
add     a,-b;tmp
demux   m1;tmp;b0;b1;a,b,res
unreg   tmp branch  b0;a,b,res
call    dosomething;a,b;res
unbranch b0;a,b,res branch  b1;a,b,res
call    somethingelse;a,b;res
unbranch b1;a,b,res mux     m1;a,b,res
```

```
int i;
for (i = 0; i < n; i++)
        res=dosomething(val,i);
```

```
reg     i,val,res
add     0;i      // initialize begin   l1;val,n,res;i
reg     borrow
add     i,-n;;borrow loop    l1;borrow;val,n,res;i
unreg   borrow
call    dosomething;i,val;res iterator l1,i
add     i,1;i
iterate l1,i end     l1;val,i;res
```

```
int res=c;
int i;
for (i = 0; i < n;i++)
    res=dosomething(res);
```

FIG. 9

```
reg     i,res
add     c;res
add     0;i
begin   l1;n,res;i
reg     borrow
add     i,-n;;borrow
loop    l1;n,res;i
unreg   borrow
// setup code for dosomething?
wait    l1;res
call    dosomething;res;res
sync    l1;res
iterator l1;i
add     i,1;i
iterate l1;i
end     l1;i,res
```

FIG. 10

```
void fir_gen(short* x, short* h, short* r, int nh, int nr)
{
        int i, j, sum;
        for (j=0; j<nr; j++)
        {
                sum = 0;
                for (i=0; i<nh; i++)
                        sum +=x[i+j]*h[i];
                r[j]=sum>>15;
        }
}
```

FIG. 12

```
enter       fir_gen;x,h,r,nh,nr
    reg             j,sum
    add             0;j
    begin           f1;sum,x,h,r,nh,nr;j
        reg             tmp
        add             j,-nr;;tmp
        loop            f1;tmp;sum,x,h,nh,nr;j
        unreg           tmp reg             i
        add             0;sum,i
        begin           f2;j,sum,x,h,nh;i
            reg     tmp
            add     i,-nh;;tmp
            loop    f2;j,sum,x,h,nh;i add     i<<1,j<<1,x;tmp
                readaddr    tmp,2,1
            reg     tmp1
                add     i<<1,h;tmp1
            read    tmp
            readaddr        tmp1,2,1
            read    tmp1
                multiply        tmp,tmp1;tmp
                wait w2,sum
                add  sum,tmp;sum
                sync w2,sum iterator f2,i
                add   i,1;i
                iterate         f2,i
        end             f2;sum,I
        reg             tmp
        add             j<<1,r;tmp
        writeaddr tmp,2,1
        unreg           tmp
        write           sum>>15 iterator    f1,j
        add             j,1;j
        iterate     f1,j
    end             f1,j
```

FIG. 13

```

#File Name: Unroll.profile
#Test Bench Name: TestGenToForToInnerLoopUnroll
#Format: time_stamp model_name model_state

0 s 12_begin R
0 s 12_loopcondition R
0 s 12_loop R
0 s 12_loop R
0 s 12_multiply R
0 s 12_add_1 R
0 s 12_add_2 R
0 s 12_add_3 R
0 s 12_add_4 R
0 s 12_12iterator R
0 s 12_12iterator R
0 s Unroll1_m6_condition_1 R
0 s Unroll1_m6_condition_2 R
0 s Unroll1_m6_bitwise_1 R
0 s Unroll1_m6_bitwise_1 R
0 s Unroll1_m6_Demux R
0 s Unroll1_INL0_m0_Cond_tR_ on
0 s Unroll1_INL0_m0_DemuxR
0 s Unroll1_b0_0_add_1 R
0 s Unroll1_b0_0_add_1 R
0 s Unroll1_INL0_b0_1_add_1 R
0 s Unroll1_INL0_b0_1_add_2 R

....

30 ns 12_end R
30 ns 12_end R
30 ns 12_multiply W
30 ns 12_multiply R
30 ns 12_add_1 W
30 ns 12_add_1 R
30 ns 12_add_3 W
30 ns 12_add_3 R
30 ns 12_add_2 W
30 ns 12_add_2 R
30 ns 12_add_4 W
30 ns 12_add_4 R
40 ns 12 begin R
```

FIG. 14

| | | |
|---|---|---|
| 0 s | 12_add_1 | R |
| 30 ns | 12_add_1 | W |
| 30 ns | 12_add_1 | R |
| 40 ns | 12_add_1 | R |
| 250 ns | 12_add_1 | W |
| 250 ns | 12_add_1 | R |
| 260 ns | 12_add_1 | R |
| 290 ns | 12_add_1 | W |
| 290 ns | 12_add_1 | R |
| 300 ns | 12_add_1 | R |
| 540 ns | 12_add_1 | W |
| 540 ns | 12_add_1 | R |
| 550 ns | 12_add_1 | R |
| 580 ns | 12_add_1 | W |
| 580 ns | 12_add_1 | R |
| 590 ns | 12_add_1 | R |
| 620 ns | 12_add_1 | W |
| 620 ns | 12_add_1 | R |
| 630 ns | 12_add_1 | R |
| 860 ns | 12_add_1 | W |
| 860 ns | 12_add_1 | R |
| 870 ns | 12_add_1 | R |
| 900 ns | 12_add_1 | W |
| 900 ns | 12_add_1 | R |
| 910 ns | 12_add_1 | R |
| 940 ns | 12_add_1 | W |
| 940 ns | 12_add_1 | R |
| 950 ns | 12_add_1 | R |
| 1220 ns | 12_add_1 | W |
| 1220 ns | 12_add_1 | R |
| 1230 ns | 12_add_1 | R |
| 1260 ns | 12_add_1 | W |
| 1260 ns | 12_add_1 | R |
| 1270 ns | 12_add_1 | R |
| 1300 ns | 12_add_1 | W |
| 1300 ns | 12_add_1 | R |
| 1310 ns | 12_add_1 | R |
| 1580 ns | 12_add_1 | W |
| 1580 ns | 12_add_1 | R |
| 1590 ns | 12_add_1 | R |
| 1620 ns | 12_add_1 | W |
| 1620 ns | 12_add_1 | R |
| 1630 ns | 12_add_1 | R |
| 1880 ns | 12_add_1 | W |
| 1880 ns | 12_add_1 | R |
| 1890 ns | 12_add_1 | R |

FIG. 15

PROFILING A HARDWARE SYSTEM GENERATED BY COMPILING A HIGH LEVEL LANGUAGE ONTO A PROGRAMMABLE LOGIC DEVICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates to the field of electronic circuit design and, more particularly, to profiling a hardware system generated from a high level language representation of the hardware system.

DESCRIPTION OF THE RELATED ART

Traditionally, designs for hardware systems, such as electronic circuits, have been specified using a hardware description language (HDL). Examples of HDLs can include, but are not limited to Verilog and VHDL. HDLs allow circuit designers to design and document electronic systems at various levels of abstraction. Designs for programmable logic devices (PLDs), such as field programmable gate arrays (FPGAs) and application specific integrated circuits (ASICs), can be modeled using an HDL. The design then can be simulated and tested using appropriate software-based design and/or synthesis tools.

High level programming languages (HLLs) also can be used to design electronic circuits. An HLL, such as Fortran, C/C++, JAVA, or the like, can be used to write a programmatic implementation of an algorithm, which can be translated into a circuit design. This approach allows a developer to concentrate on an algorithmic solution to a problem rather than the specific hardware involved. A variety of different tools are available which can translate the HLL program into a synthesizable netlist or other software-based circuit representation.

One advantage of using an HLL is that many of the complexities of circuit design, particularly with regard to programming an FPGA, can be reduced. Many of the design decisions can be made by the implementation tools based upon an analysis of the HLL program. Still, the hardware that ultimately is generated from the HLL program, though functional, may be inefficient and, therefore, require refinement. In such cases, it becomes necessary to identify those portions of the circuit design that do require further refining or optimization.

It would be beneficial to provide a technique for profiling a hardware system created from an HLL program to identify potential shortcomings or bugs.

SUMMARY

One embodiment of the present invention relates to a method of profiling a hardware system. The method can include compiling a high level language program into an assembly language representation of the hardware system. Instructions of the assembly language representation of the hardware system can be translated into a plurality of cycle-accurate, software-emulation models. One or more of the plurality of models can be instrumented with code that, when executed, provides operating state information relating to the model as output. An indication of expected behavior of the hardware system can be provided by executing the models in an emulation environment.

The method also can include identifying at least one model that is in a read state for at least two consecutive cycles of an emulation of the hardware system. An indication that a component of the hardware system that is represented by the identified model can be provided which specifies that the component can be shared. Compiling the high level language program can include identifying constructs of the high level language program and mapping the constructs to instructions and pseudo-instructions of the assembly language.

Translating instructions of the assembly language representation can include creating models of hardware components for the hardware system according to instructions of the assembly language. Models of first-in-first-outs that couple the models of the hardware components for the hardware system according to operands of the instructions of the assembly language representation can be created.

Indicating expected behavior can include indicating an operating state of at least one instrumented model during emulation. In another aspect, indicating expected behavior can include storing operational state information, generated during emulation, for at least one of the plurality of instrumented models.

Another embodiment of the present invention can include a method of profiling a hardware system including compiling a high level language program into an assembly language representation of the hardware system and translating instructions of the assembly language representation of the hardware system into a plurality of hardware description language (HDL) models. One or more of the plurality of HDL models can be instrumented with code that, when implemented within a programmable logic device, instantiates hardware structure that provides operating state information for a component corresponding to the instrumented HDL model. The method further can include indicating expected behavior of the hardware system by configuring the programmable logic device using the instrumented HDL models and running a simulation with the programmable logic device.

The method further can include identifying at least one component instantiated by an instrumented HDL model that is in a read state for at least two consecutive cycles of a simulation. An indication that the component of the hardware system can be provided that specifies that the component can be shared. Compiling the high level language program can include identifying constructs of the high level language program and mapping the constructs to instructions and pseudo-instructions of the assembly language.

Translating instructions of the assembly language representation can include creating HDL models of hardware components for the hardware system according to instructions of the assembly language. Translating instructions of the assembly language representation also can include creating HDL models of first-in-first-outs that link the HDL models of hardware components for the hardware system according to operands of the instructions of the assembly language representation.

Indicating expected behavior can include, within a host computing system, receiving operating state information during simulation for at least one component instantiated within the programmable logic device that corresponds to an instrumented HDL model. In another aspect, indicating expected behavior can include storing the operating state information within the host computing system.

Yet another embodiment of the present invention can include a computer program product having computer-usable code that, when executed by an information processing system, implements the various steps and/or functions disclosed herein.

BRIEF DESCRIPTION OF THE DRAWINGS

Presently preferred embodiments are shown in the drawings. It should be appreciated, however, that the invention is not limited to the precise arrangements and instrumentalities shown.

FIG. 9 illustrates another example of an HLL "for" construct.

FIG. 10 illustrates an assembly language translation of the HLL "for" construct shown in FIG. 9 in accordance with the inventive arrangements disclosed herein.

FIG. 12 illustrates an example of an HLL finite impulse response (FIR) filter implementation.

FIG. 13 illustrates an assembly language translation of the HLL FIR implementation of FIG. 12 in accordance with the inventive arrangements disclosed herein.

FIG. 14 is a listing of operating state information for a circuit design in accordance with another embodiment of the present invention.

FIG. 15 is a listing of operating state information for a circuit design in accordance with another embodiment of the present invention.

DETAILED DESCRIPTION OF THE INVENTION

Figure 1:
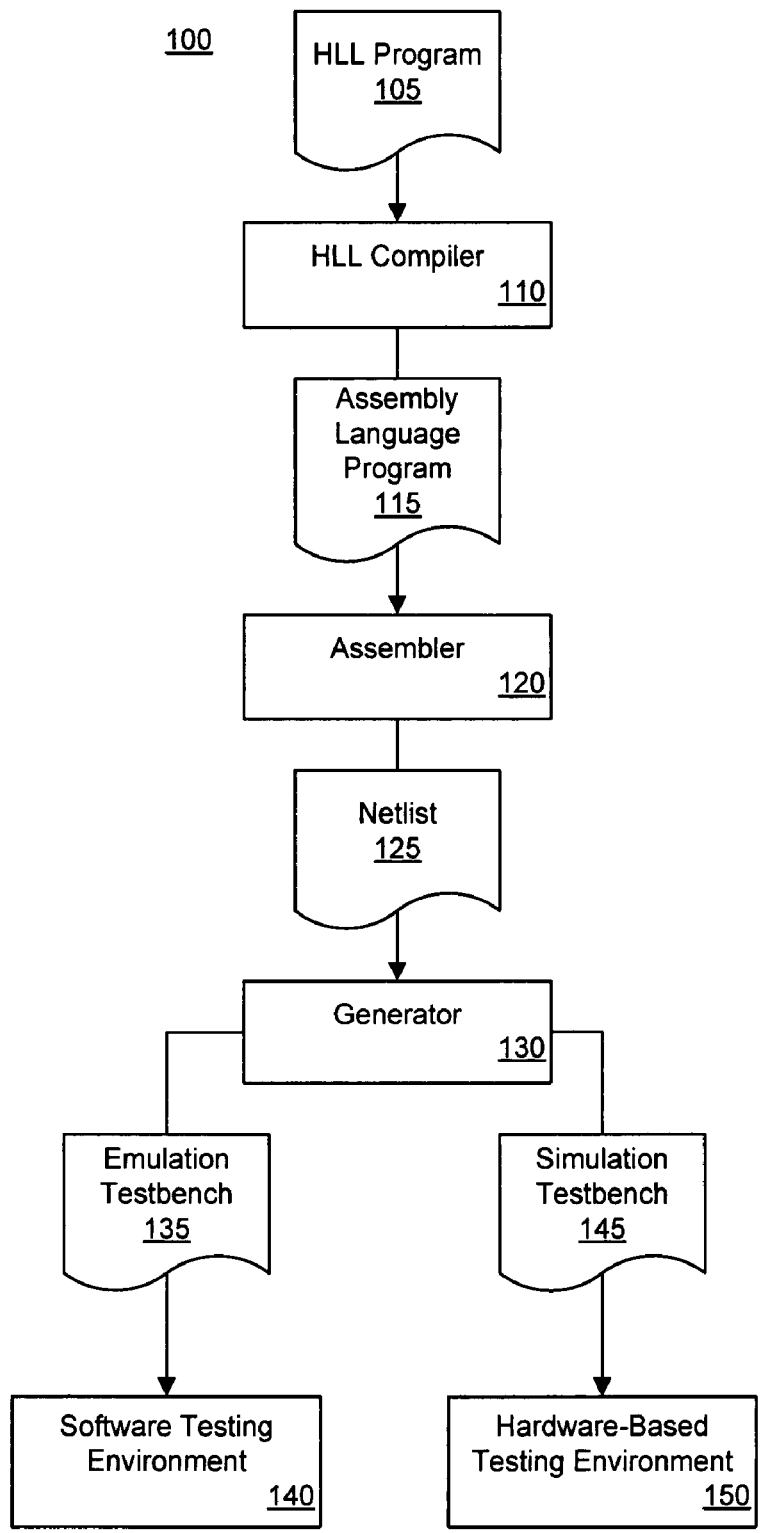
FIG. 1 is a block diagram illustrating a system for profiling a circuit design in accordance with one embodiment of the present invention.

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to profiling a hardware system. More particularly, a circuit design, originally developed from a high level language (HLL) program, can be profiled to determine whether one or more portions of the circuit design require further refinement. In accordance with the embodiments disclosed herein, an HLL program implementation of an algorithm can be compiled into an assembly language program. From the assembly language program, a netlist can be generated, from which a plurality of models can be created. The models can be instrumented with code that reports operating information relating to the models. This operating information can be reviewed to determine expected behavior of a circuit design that is generated by translating the HLL program. The operating information can be used to locate potential bugs or inefficiencies in the resulting circuit design.

Development of a circuit design in accordance with the embodiments disclosed herein can result in a highly-pipelined circuit design. Relying upon pipelining, as opposed to parallelization, allows circuit developers to think in terms of sequential steps rather than parallel processes, thereby achieving a more intuitive design methodology. The use of pipelining also can increase computational efficiency as a loop of "N" iterations would require N times the number of cycles (C) to complete on a conventional Von Neuman architecture-type machine. Using a pipelined machine, such a loop would require N+C cycles to complete.

Within a highly pipelined architecture, performance degradation can result from a variety of different reasons including, but not limited to, consumers waiting for data to appear at the input FIFO(s) of the consumers, producers waiting for space to become available on the output FIFO(s) of the producers, and memory congestion resulting in a memory throughput that is lower than needed. Consumers and producers can refer to instructions of programs. It is these instructions that are translated into hardware on a target device. It is useful to detect such potential problems by profiling the circuit design through emulation and/or simulation. Profiling can indicate a need for modifying the circuit design by, for example, adjusting FIFO depth and/or adjusting the number of memory requests served per clock cycle.

FIG. 1 is a block diagram illustrating a system 100 for profiling a circuit design in accordance with one embodiment of the present invention. As shown, an HLL program 105 can be loaded into an HLL compiler 110. The HLL program 105 can embody an algorithm or function that is to be translated into a circuit design for implementation in hardware. For example, the circuit design ultimately can be implemented using a target device such as a programmable logic device (PLD) or, more particularly, a field programmable gate array (FPGA). In any case, the HLL program 105 can be implemented using any of a variety of different HLLs, whether Fortran, C/C++, JAVA, or the like.

The HLL compiler 110 can parse the HLL program 105 and produce an intermediate format of the HLL program 105 as output. The compiler can be configured to parse the type of HLL in which the HLL program 105 is coded. As such, the compiler 110 can parse the HLL program 105 and resolve each sequential source program instruction of the HLL program 105 into its constituent parts. Further, the HLL compiler 110 can determine whether the HLL program 105 conforms to a defined standard syntax for the HLL.

The HLL compiler 110 then can operate upon the parsed HLL program 105 and translate the parsed HLL program 105 into the intermediate format. In one embodiment, the intermediate format can be an assembly language program 115, which, like the HLL program 105, embodies an algorithm to be implemented in hardware. The assembly language program 115 can be read by a human being and further, due to the characteristics of the assembly language in which the assembly language program 115 is implemented, can be edited by a designer to refine the circuit design if so desired. Thus, in one embodiment, the HLL program 105 can be compiled into as assembly language referred to as "CHiMPS" assembly instructions. CHiMPS is an acronym that stands for "compiling HLL into massively pipelined systems".

CHiMPS assembly language, like conventional assembly languages, utilizes op-code mnemonics and operands. Within the CHiMPS assembly language, instructions and pseudo-instructions are used. The HLL compiler 110 can map the constructs of the HLL program 105 onto these instructions and pseudo-instructions. Generally, instructions cause some type of hardware to be generated, while pseudo-instructions provide information to the assembler 120. Instructions correspond to predefined hardware modules and operands of instructions correspond to FIFOs or registers. In other words, the instructions of the assembly language program 115 typically correlate to, and can be converted into, instantiations of predefined hardware modules. The predefined hardware modules act on the operands of the instructions, which correlate to FIFOs that couple the various hardware modules (instructions).

The assembly language program 115 can be provided to an assembler 120. The assembler 120 can process the assembly language program 115 and translate it into a netlist 125. The assembler 120 can be implemented as a single pass assembler. A preprocessor, however, can be included which can resolve any include files and define instructions. The netlist 125 can be a structural HDL netlist that specifies FIFO's and logic blocks.

The netlist 125, due to the use of CHiMPS, results in a circuit design that is likely to be highly pipelined. The netlist 125 further will specify a circuit design having structures corresponding to CHiMPS instructions with FIFOs coupling such structures. As noted, within such highly pipelined architectures, performance degradation can result from conditions such as data consumers waiting for data to appear at the input FIFO(s) of the consumers, producers waiting for space to become available on the output FIFO(s) of the producers, and memory congestion resulting in memory throughput that is lower than the needed bandwidth. It can be useful to detect such conditions by profiling the circuit design through emulation and/or simulation. Profiling can indicate bugs or errors which may be corrected by adjusting FIFO depth, adjusting the number of memory requests served per clock cycle, etc.

As shown, the netlist 125 can be provided to a generator 130. The generator 130 can be configured to translate the netlist 125 into any of a variety of different software-based models. In one embodiment, the generator 130 can create an emulation testbench 135 from the netlist 125. As known, a testbench refers to a circuit description that specifies and verifies the behavior of a device under test (DUT), in this case a circuit design for a PLD. A testbench also can refer to the code used to create a pre-determined input sequence to the DUT, as well as the code responsible for observing the response from the DUT.

The emulation testbench 135 can include one or more emulation models (not shown). In general, emulation refers to the process of duplicating, or replicating, the functions of one system with a second system such that the second system appears to behave like the first. For example, emulation can refer to the case in which software-based models are executed within a software test environment to reflect the behavior of the emulated system, in this case the circuit design. Emulation, in general, is considered to take a higher level view of a system than simulation. Emulation, however, still can provide sufficient information for diagnosing problems typically associated with highly pipelined architectures.

In one embodiment of the present invention, the emulation testbench 135 can be implemented using SystemC™. As known, SystemC™ provides hardware-oriented constructs in the form of a class library implemented in standard C++. It should be appreciated that while SystemC™ is presented as one way in which the emulation testbench 135 and emulation models can be implemented, other modeling systems, languages, and/or techniques can be used so long as such models are executable within a software-based test environment. Accordingly, the present invention is not intended to be limited by the particular format or manner in which the emulation testbench 135 and/or emulation models are implemented.

In this regard, the translation of the assembly language program 115 into a netlist 125 can be an optional step. In some cases, for example, based upon the type of emulation testbench 135 used, it may be more convenient to translate the assembly language program 115 into the netlist 125. Such is the case where standard tools are available for deriving the emulation testbench 135 from the netlist 125. In other cases, for example, where proprietary emulation models are used, the assembly language program 115 can be translated directly into the emulation testbench 135 from the assembly language program 115.

In any event, the emulation testbench 135 can be provided to a software testing environment 140. For example, if the emulation testbench 135 is implemented using SystemC™, a test platform capable of executing SystemC™ emulation models can be used. The particular software testing environment 140 that is used can vary according to the implementation of the emulation testbench 135.

In another embodiment, the generator 130 can translate the netlist 125 into a simulation testbench 145. Simulation, as compared with emulation, can refer to the case where an attempt is made to precisely model the state of the device being simulated, in this case the circuit design that is generated from the HLL program 105. For example, simulation can refer to the case where the simulation testbench 145 is implemented using HDL and HDL models, which can be used for simulating a circuit design within a software-based synthesis and simulation tool or to generate the configuration bitstream necessary for programming an actual PLD for testing using a hardware platform, i.e. hardware-based testing environment 150. As was the case with the emulation testbench 135, in another embodiment, the simulation testbench 145 can be derived directly from the assembly language program 115.

The simulation testbench 145 and simulation models can be implemented using an HDL such as VHDL, Verilog, or the like. While the simulation testbench 145 can be provided to a software-based simulation tool, in another embodiment, the simulation testbench 145 is used within the hardware-based testing environment 150. The hardware-based testing environment 150 can include a simulator executing within a suitable host computer system. The host computer system can be coupled with a hardware platform capable of hosting a target PLD within which the circuit design will be instantiated. The simulator can process the simulation testbench 145 to produce a configuration bitstream which can be loaded into the PLD disposed upon the hardware platform. In this embodiment, the circuit design can be simulated by configuring an actual PLD using the configuration bitstream generated from the simulation testbench 145. Testing of the PLD upon the hardware platform can be performed in cooperation with the host computer system executing the simulator.

If the netlist 125 is used to create the bitstream necessary for programming a PLD, once the PLD is programmed with the circuit design, the circuit design can be executed or run. At that time, execution threads can be identified rather than at the time the HLL program 105 is compiled. Each time an execution thread is generated, i.e. a new branch of a conditional branch is started or a new iteration and/or repetition of a loop is started, that execution thread can be identified. Each execution thread can be associated with an identifier, referred to as a sequence number. The sequence numbers can be used within the circuit design to emulate flow control of the HLL program 105. It should be appreciated, however, that other ways of preserving the order defined by the HLL program 105 can be used and that the embodiments disclosed herein are not limited to one particular technique of preserving such order.

Generally, each sequence number corresponds to a particular execution thread and conveys scheduling information for the circuit design, thereby facilitating a pipelined architecture and achieving a degree of parallelism within the circuit design. The circuit can execute the execution threads in parallel or in a pipelined fashion. This alleviates the need to add additional stages to branches from conditional statements so that each branch requires the same amount of time to complete.

Within the CHiMPS assembly language, pseudo-instructions provide information to the assembler 120 thereby providing context to the set of instructions following the pseudo-instruction. Examples of pseudo-instructions can include, but are not limited to, reg, unreg, call, enter, and exit. Some pseudo-instructions may indirectly cause hardware to be generated, such as the reg pseudo-instruction. The reg pseudo-instruction can lead to the creation of one or more FIFOs when those registers are used. It should be appreciated that the creation of the FIFOs is incidental to the instruction that creates the hardware and not to the pseudo-instruction that declared the hardware.

The syntax of the reg pseudo-instruction is: reg <list of registers>. The reg pseudo-instruction tells the assembler that the named registers in the list of registers will be used in upcoming instructions. The list of registers will be created with a default list of 32 bits unless otherwise specified. The reg pseudo-instruction instructs the assembler to create FIFOs to carry the values of each register through the instructions that follow until the registers are "unreged".

The unreg pseudo-instruction specifies a listing of registers that will no longer be used. The syntax of the unreg pseudo-instruction is: unreg <list of registers>. As with the reg pseudo-instruction, the operands of the pseudo-instruction are the registers within the list of registers. Any FIFOs associated with the listed registers can be trimmed back to the point of their last use. The name space will be purged of the named register(s), thereby freeing the registers for use again if needed.

The call pseudo-instruction will cause the assembler to search for a function with a matching name. The syntax for this pseudo-instruction is: call <function name>[;[<input registers>] [;<output registers>]]. The assembler will replace the call pseudo-instruction with the entire contents of the function. Thus, rather than including a reference to the called function, a full copy of the function can be made. The input registers specify the inputs to the function and the output registers will contain the outputs of the function. Default widths for the registers can be assumed unless otherwise stated within the call pseudo-instruction.

The enter pseudo-instruction defines a function that can be called. The syntax for the enter pseudo-instruction is: enter <function name>[;<input registers>]. The input registers specified serve as placeholders for registers that will be passed into the specified function from the calling function. The exit pseudo-instruction signals the end of the function defined by the enter pseudo-instruction. Code between the enter and exit pseudo-instructions will be copied wherever the call is made. The output registers specified will define which FIFOs are to be mapped to the output registers specified on the call statement.

Instructions, as noted, typically cause hardware to be instantiated. Generally, one instruction causes one instantiation of a hardware component. Instructions are composed largely of operational instructions and flow-control instructions. Operational instructions wait for all arguments to appear on the input FIFOs. When those arguments are available, the operational instruction performs the specified function and one or more output FIFOs are provided with the result. By comparison, flow-control instructions generally split or merge the pipeline based on information either from prior instructions or by using the sequence numbers corresponding to the execution threads of the HLL program.

Operational instructions can include, but are not limited to, integer arithmetic instructions, logical operation instructions, and floating-point arithmetic instructions. In illustration, integer arithmetic functions can include, addition, subtraction, multiplication, and division, which typically take one cycle to operate. Still, more complex instructions, such as divide, can require additional cycles. Logical operation instructions can include shift operations such as logical shift right or left and arithmetic shift right or left. These operations can be handled within registers and typically require no cycles to complete.

Flow control instructions can include conditional branching and looping instructions. Examples of conditional branching instructions can include the demux, branch, unbranch, and mux instructions. The syntax of the demux instruction is: demux<muxid>[:n]<condition>;<branch0id>; <branch1id>;<list of registers>. The demux instruction examines the <condition>. Depending upon the value of <condition>, the instruction de-multiplexes the specified registers along with the sequence number corresponding to the code associated with either branch instruction specified by <branch0id> or <branch1id>.

If the value of the <condition> operand is zero, then the code labeled <branch0> receives the registers, otherwise <branch1> receives the registers. The <muxid> operand is a unique identifier used to match a particular demux instruction up with both the branches and the corresponding mux instruction. The number "n" indicates the depth of the FIFO that needs to be allocated for registers, including the sequence number that are not passed into the conditional. Generally, the number should be equal to the number of instructions in the longer of the two branches. If not specified, a default depth can be used.

The branch instruction initiates code belonging to a specific branch as specified by the <branchid> operand of the demux instruction. The syntax of the instruction is: branch <branchid>;<list of registers>. Branch is actually a pseudo-instruction as no hardware is generated. A new register namespace is created containing only those registers in the <list of registers>, which must exactly match the list specified by the demux instruction.

The unbranch instruction, like the branch instruction, is a pseudo-instruction. The unbranch instruction indicates the end of a particular branch. The register namespace is restored to its value prior to the most recent branch instruction with a matching <branchid>. The syntax for the unbranch pseudo-instruction is: unbranch <branchid>;<list of registers>.

The mux instruction multiplexes the list of registers back together depending upon the sequence number passed by the demux instruction having a matching <muxid>. The syntax for the mux instruction is: mux<branchid>;<list of registers>.

Figure 2:
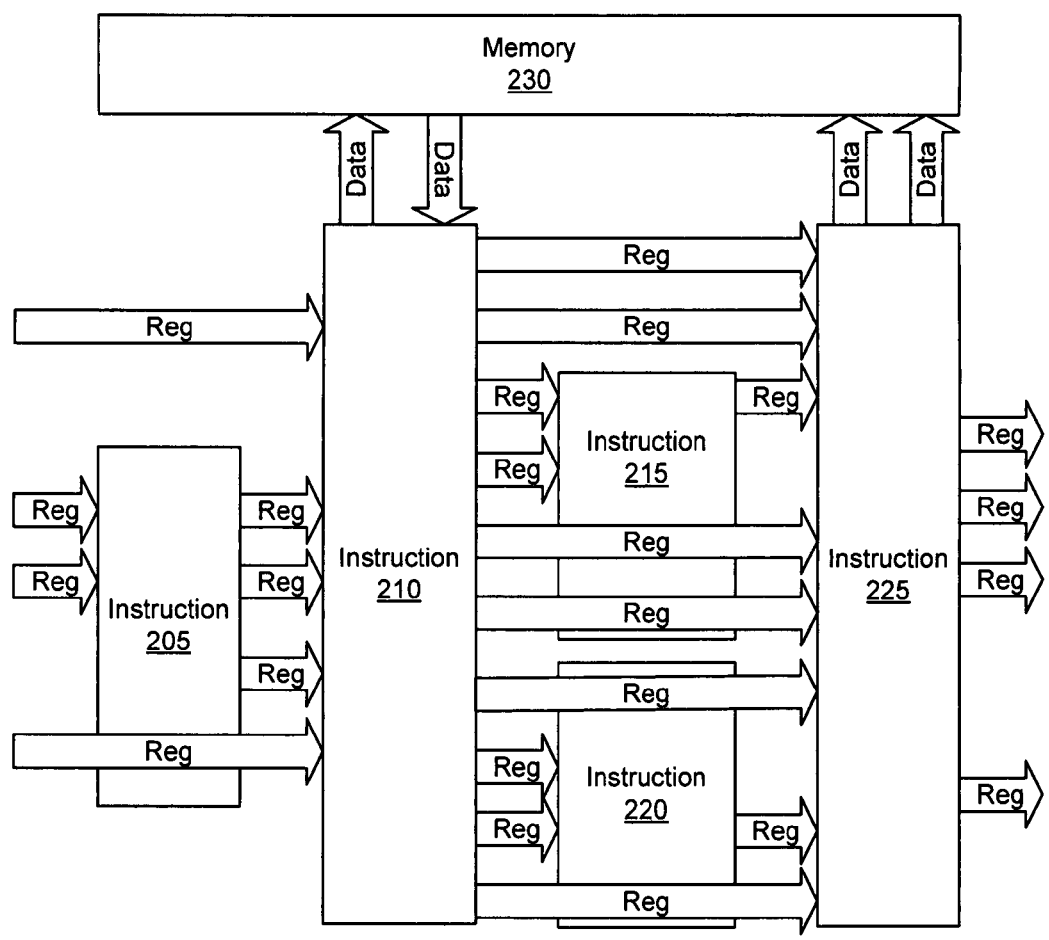
FIG. 2 is graphical representation of a netlist which has been generated in accordance with the embodiments disclosed herein.

FIG. 2 is graphical representation of a netlist 200 which has been generated in accordance with the embodiments disclosed herein. The instructions 205, 210, 215, 220, and 225 of the assembly language correspond to hardware modules in the resulting circuit design. The arguments of the assembly language instructions 205-225 are depicted as registers, or FIFOs, communicatively linking the various instructions 205-225. In general, a one to one correspondence can persist between the assembly language instructions, the models, as well as the hardware modules or components that ultimately are instantiated in a PLD.

State information as well as intermediate results produced by the instructions 205-225 flow through the FIFOs. Array structures can be implemented as memory blocks, such as memory 230. As shown, instructions, i.e. instructions 210 and 225, can access the memory 230 via FIFOs. An instruction can operate whenever data is available on the input FIFO(s) to that instruction and then output results onto the output FIFO (s) for the instruction.

As shown in FIG. 2, the hardware generated using CHIMPS instructions effectively forms a system of data producers and data consumers. The instructions, i.e. the op-codes, correspond to hardware modules which can be viewed as data consumers and/or data producers. The operands of the instructions correspond to FIFOs that link the data producers and consumers. Within this framework, each instruction of the assembly language program can be viewed as a state machine having three states: a read (R) state, a write state (W), and an execute (E) state.

A given instruction, and thus model, can be said to be in a read state while waiting for data to appear on the input FIFO (s) of that instruction. When data is available, the instruction can enter the execute state. Upon completion of execution, the instruction can switch to the write state. Once data is written to the output FIFO(s) of the instruction, the instruction can switch back to the read state. In general, if input data to an instruction is available and the output FIFO(s) are not full, the instruction can have a one-cycle latency in that the instruction can move through the read, execute, and write states within that clock cycle.

Figures 3, 4, 5:
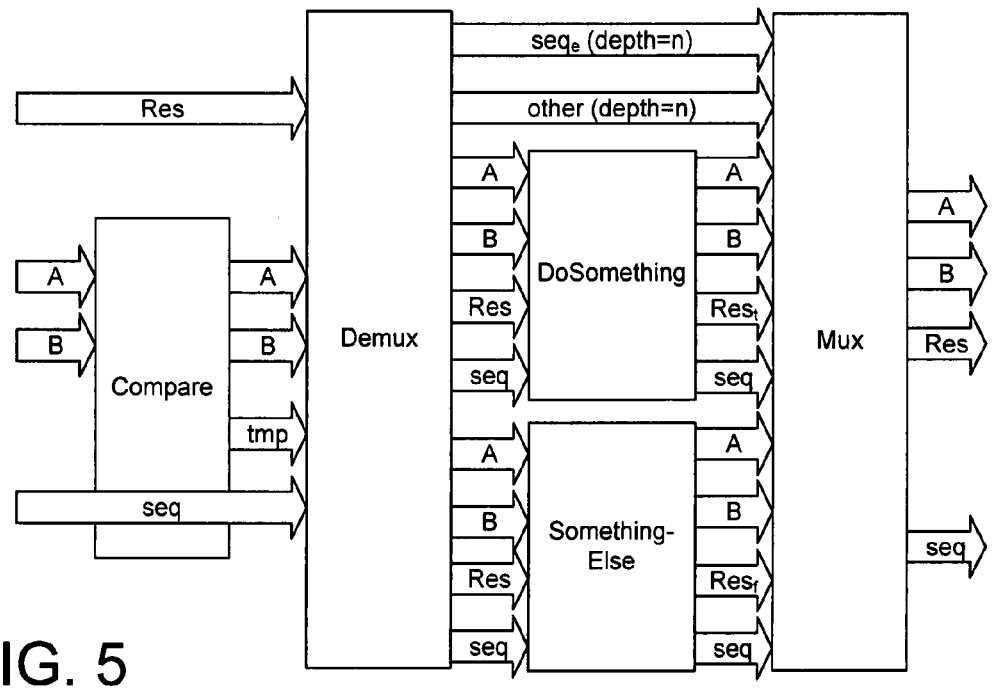
FIG. 3 illustrates an example of a high level language (HLL) "if" construct.
FIG. 4 illustrates an assembly language translation of the HLL "if" construct shown in FIG. 3 in accordance with the inventive arrangements disclosed herein.
FIG. 5 is a schematic diagram illustrating a circuit design generated from the assembly language translation of FIG. 4 in accordance with the inventive arrangements disclosed herein.

FIG. 3 illustrates an example of an HLL "if" construct. A construct refers to a data structure used for a particular purpose. A construct can refer to a single programming language statement or a collection of more than one statement such as a loop, method, function, or the like, where the collection has a particular function or purpose. Constructs also are defined by organizations such as the Institute of Electrical and Electronics Engineers (IEEE) and the American National Standards Institute (ANSI). These organizations set forth standards for programming languages such as C, C++, Verilog, and VHDL, with each standard defining the available constructs for a given language.

In any case, the "if" construct illustrated in FIG. 3 can be incorporated into a larger HLL programmatic representation of a hardware design. When provided to a compiler as described herein, the constructs of the HLL program can be identified and an assembly language representation in the CHiMPS assembly language can be generated. FIG. 4 illustrates the CHiMPS assembly language translation or representation of the HLL "if" construct. The CHiMPS code shown in FIG. 4 illustrates the conditional branching instructions demux, branch, unbranch, and mux described above.

From the assembly language representation shown in FIG. 4, the compiler generates a netlist. The netlist specifies the pipelined hardware configuration depicted in FIG. 5. As shown, the instructions of the assembly language representation have been transformed into hardware instantiations and the operands have become FIFOs linking the hardware instantiations. In this case, the add instruction corresponds with the compare hardware module.

Generally, a loop in the CHIMPS assembly language includes four stages. The stages include initialization, test for exit condition, body, and iterator. The initialization can be performed prior to the start of the loop. The three other stages can execute iteratively and should occur in parallel. The following list specifies the general structure of a loop with the stages being shown in bold: initialization code, begin instruction, test for exit, loop instruction, loop body, iterator instruction, iterator code, iterate instruction, end instruction.

It should be appreciated that while the iterator code is shown after the loop body, it executes in parallel with the loop body. Accordingly, any modification of the loop variables which occurs in the iterator stage will not be visible to the loop body stage until the next iteration. Further, the loop body cannot affect the iterator variables. Any instructions that do so need to be moved or replicated within the iterator code.

Looping instructions within the CHiMPS assembly language can include the begin, loop, end, iterator, and iterate instructions alluded to above. The syntax for the begin instruction is: begin <loopid>;<loop registers>;<iterator registers>. The begin instruction creates a new register called the end FIFO which is pushed to the corresponding end instruction. If the <iterator registers> receive values, these values replace the copies stored in the internal memory and a new set of outputs is sent downstream. If the end FIFO becomes empty, the loop restarts. The begin instruction further generates a local sequence number that is passed to the instructions inside the loop and then incremented each time values are passed downstream.

The loop instruction de-multiplexes the loop registers either to the body or to the end instruction. If the condition is nonzero, the loop registers are de-multiplexed to the body. Additionally, the iterator registers are copied to the iterator instruction. If the condition is zero, the loop registers are de-multiplexed to the end instruction. The syntax for the loop instruction is: loop <loopid>;<condition>;<loop registers>; <iterator registers>.

The iterator instruction identifies the start of the iterator code for the identified loop as well as the registers that will be passed into the iterator code from the loop instruction. The syntax for the iterator instruction is: iterator <loopid>;<iterator registers>. The iterate instruction identifies the end of the iterator code for the loop so identified along with the registers that will be passed back to the begin statement for the next iteration. The syntax for the iterate instruction is: iterate <loopid>;<iterator registers>.

The end instruction identifies the end of the loop code along with the result registers that will be passed on at the end of the loop. The syntax of the end instruction is: end <loopid>;<result-regs>. The end instruction receives registers from the loop body and end of the loop from the loop instruction. With the registers from the loop instruction, the end instruction pulls the sequence number from the end FIFO. During execution of the loop, the end instruction continually discards the result registers from the loop, saving the last set. Once the loop ends, the end instruction waits until the result FIFOs have a sequence number which is exactly equal to the sequence number being passed from the end instruction minus one. This set of resulting values is passed on with the others being discarded.

Figures 6, 7, 8:
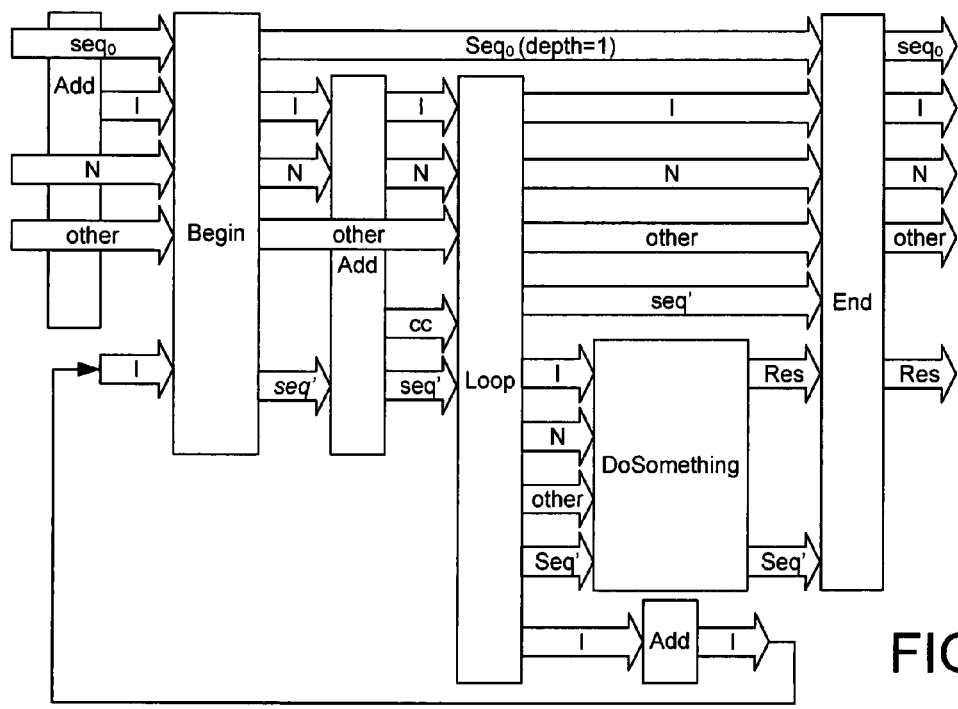
FIG. 6 illustrates an example of an HLL "for" construct.
FIG. 7 illustrates an assembly language translation of the HLL "for" construct shown in FIG. 6 in accordance with the inventive arrangements disclosed herein.
FIG. 8 is a schematic diagram illustrating a circuit design generated from the assembly language translation of FIG. 7 in accordance with the inventive arrangements disclosed herein.

FIG. 6 illustrates an example of an HLL "for" construct. The HLL language construct can be included in a larger HLL program. The compiler can generate a CHiMPS assembly language representation or translation of the "for" construct which is illustrated in FIG. 7. The example shown in FIG. 7 illustrates the looping capability and architecture of the CHiMPS assembly language as described with reference to the begin, loop, iterator, iterate, and end instructions.

The circuitry resulting from the processing of the assembly language of FIG. 7 is illustrated in FIG. 8. As noted, each instruction has been instantiated as a hardware module. The operands of the assembly language instructions have become FIFOs linking the various hardware instantiations. Further, the sequence numbers which correspond to the execution threads of the HLL program, now are used for controlling signal flow through the resulting hardware configuration. As noted, this alleviates the need for including additional stages in the hardware design to ensure that each leg of a conditional branch matches the other in terms of timing.

FIG. 9 illustrates another example of an HLL "for" construct. The assembly language representation of the HLL "for" construct is illustrated in FIG. 10. In this case, the assembly language representation includes two additional instructions. The wait and sync instructions are included and implement aspects of the looping capability of the CHIMPS assembly language. At times, a value is altered inside of a loop and the resulting value is to be used in the next iteration of the loop. The wait and sync instructions implement this functionality.

As noted, the wait instruction is used for synchronizing modified data and data used inside a loop. The syntax of the wait instruction is: wait <waitid>;<wait registers>. The wait instruction receives two sets of registers. One set of registers, denoted as "A", flows from the prior instruction. The other set of registers, denoted as "B", flows from the sync instruction that corresponds with the wait instruction. The wait instruction stores an expected sequence number denoted as "E", that starts at −1 and is used to select which registers are to be passed through.

The sequence number E is evaluated against the sequence number corresponding to register set A. The registers can be passed through in one of two different ways. If the sequence number in set A is greater than that stored in E, then the A set of registers is passed on. In that case the expected sequence number E is set to the one in set A plus 1. If the sequence number in set A is equal to that stored in E, the B set of registers is pulled off and discarded until a set with a sequence number equal to the sequence number stored in E minus 1 is found. When found, those registers are passed on and the sequence number stored in E is incremented.

Figure 11:
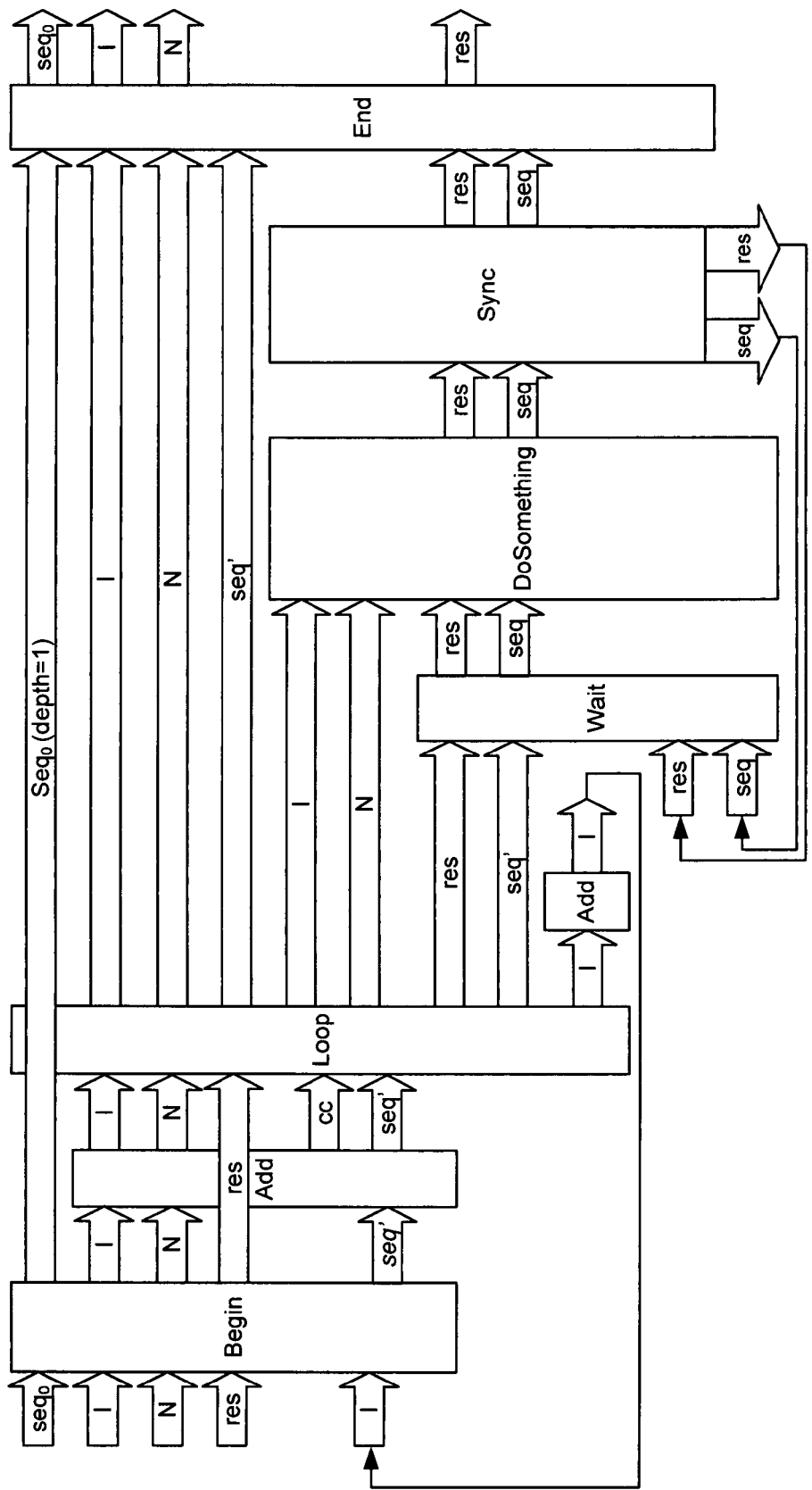
FIG. 11 is a schematic diagram illustrating a circuit design generated from the assembly language translation of FIG. 10 in accordance with the inventive arrangements disclosed herein.

The sync instruction is matched with a wait instruction, and as such, the arguments must be identical. The syntax for the sync instruction is: sync <loopid>, <list of registers>. The sync instruction duplicates registers in the register list and sends one set of registers on and the other set of registers back to the B side of the wait instruction. The wait and sync instructions must be located before and after the first and last references of variables modified during a loop. The circuitry resulting from the assembly language shown in FIG. 10 is depicted in FIG. 11.

FIG. 12 illustrates an example of an HLL finite impulse response (FIR) filter implementation. The assembly language representation of the HLL FIR filter is illustrated in FIG. 13.

FIG. 14 is a listing of operating state information for a circuit design in accordance with another embodiment of the present invention. As the models are created, the generator can instrument the models with appropriate code which causes each model to output or report its operating state at a given time, or cycle, during emulation or simulation, as the case may be. In the embodiment in which emulation models are created, the emulation models can be instrumented with code which causes one or more, or each, model to output its operating state while executing during emulation. In the embodiment in which HDL models are created, the HDL models can be instrumented with HDL which causes the necessary hardware within the target PLD for reporting such operating state information for various hardware modules to be instantiated. The state information can be provided to the host computer system through a communication link between the hardware platform and the host computing system.

In any case, the operating state information of FIG. 14 is an example of the sort of output that can be generated, whether in an emulation environment or a simulation environment. The operating state information includes data for a plurality of different models. As shown, the operating state information indicates the particular time during the simulation or emulation in which the data was generated as well as the particular component or model responsible for generating that operating state information. In this case, since each model has a single clock cycle operation latency, the execution state is not shown. The "R" indicates the model was in the read state while a "W" is indicative of the write state.

FIG. 15 is a listing of operating state information for a circuit design in accordance with another embodiment of the present invention. The operating state information shown in FIG. 15 illustrates a case in which fine resolution data with respect to the operation state of a particular model is desired. As shown, the operating state of a particular model, i.e. the "12_add_1" model is shown throughout the course of a given simulation or emulation as the case may be.

The state information that is generated by the various models can be used for a variety of diagnostic and performance enhancing functions. In one embodiment, if a particular model is in a read state for at least two consecutive cycles of an emulation of the circuit design, that condition can be indicative that the component represented by the model is waiting for data. As such, the component is a candidate for sharing, e.g., to be used for another function during the time in which the component waits. A similar conclusion can be drawn from a hardware component instantiated within a PLD as a result of an instrumented HDL model. In one embodiment, the operating state information, whether evaluated as generated, or after being generated, can be parsed such that any component that is a candidate for sharing can be identified or flagged along with the relevant cycles in which such component can be shared.

FIGS. 14 and 15 have been provided for purposes of illustration only. It should be appreciated that the manner in which operating state information is provided can vary significantly. In one embodiment of the present invention, operating state information is written to a text file. The operating state information can be viewed in real time as it is generated and/or stored for later use, whether in a flat file, a database, or the like. If desired, graphical user interface (GUI) based programs can be written to visualize the operating state information in a user selected manner. This visualization can be performed after the fact or can be performed dynamically as the emulation or simulation is executing. For example, a graphical display of pending reads, i.e. outstanding memory requests, throughout the timeline of the simulation can be provided. Such a view can be modified to portray a snapshot of a given point in time, an average over a portion or the entire simulation, or updated dynamically as the simulation progresses.

Figure 16:
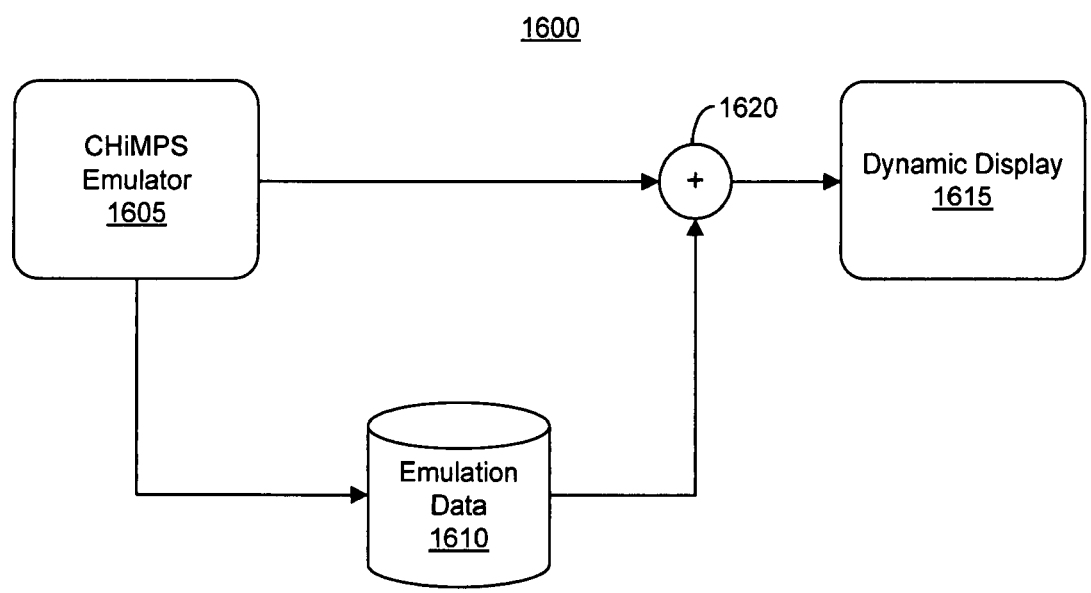
FIG. 16 is a block diagram illustrating a system in accordance with another embodiment of the present invention.

FIG. 16 is a block diagram illustrating a system 1600 in accordance with another embodiment of the present invention. As shown, the system 1600 includes a CHiMPS emulator 1605 which can execute one or more emulation models for a circuit design and an emulation data store 1610. The emulation data store 1610 can receive a stream of model state information from the CHiMPS emulator 1605 as a circuit design is emulated. The model state information for a circuit design during emulation can be presented through a dynamic display 1615, for example in graphical form. The dynamic display 1615 further can receive model state information from prior emulations and compare such data, i.e., as illustrated by adder 1620. Thus, not only can data for a current emulation be viewed dynamically, but information can be dynamically contrasted with emulation data from prior emulations or shown concurrently.

Figure 17:
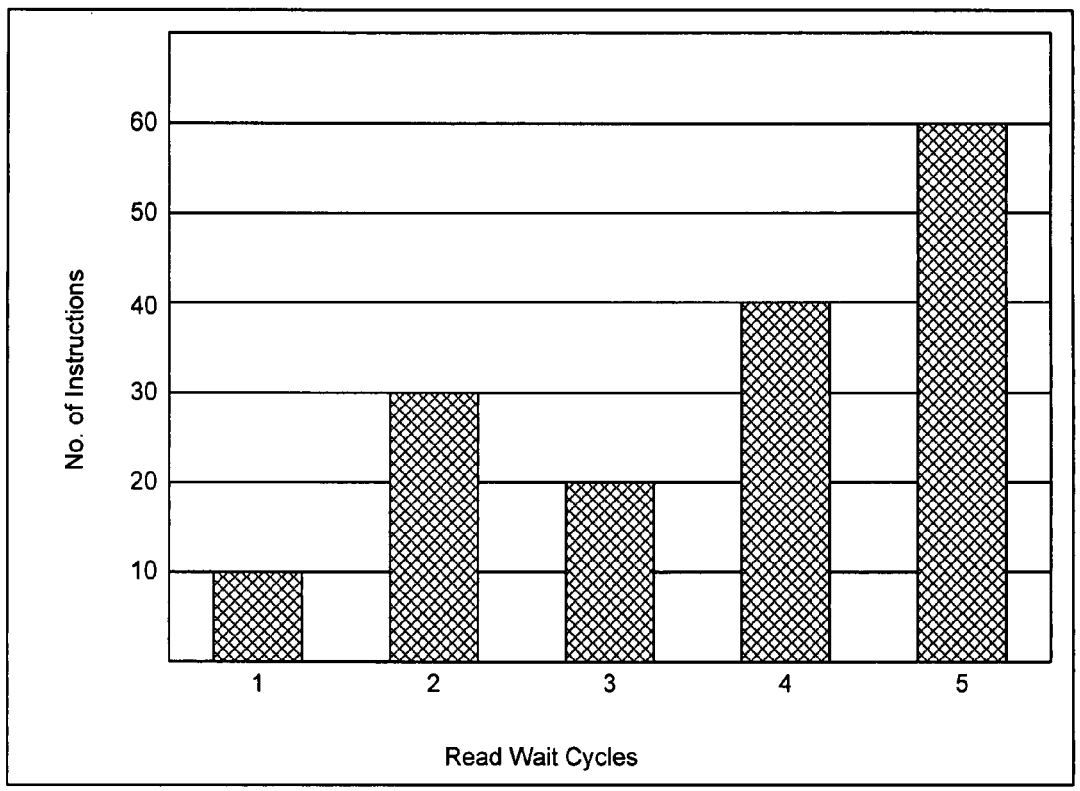
FIG. 17 is a view of operating state information presented in a graphical format in accordance with another embodiment of the present invention.

FIG. 17 is a view of operating state information presented in a graphical format in accordance with another embodiment of the present invention. In this case, the view depicts higher level information relating to the average number of wait cycles before a read operation can be executed during a simulation. Once the operating state information is collected, or as it is collected, the data can be manipulated and/or displayed in virtually any manner desired.

In another embodiment, hierarchy information corresponding to individual instructions of the HLL program is collected and evaluated. For example, correlation data describing which portions of HLL code correspond to which assembly language program instructions can be maintained. Similarly, correlation data indicating which models correspond to which assembly language instructions can be maintained. This allows a developer to associate particular items of profile information to particular items of code, whether at the HLL or assembly language level. Thus, a developer can review the performance of a particular set of instructions since those instructions can be correlated with the emulation models.

Figure 18:
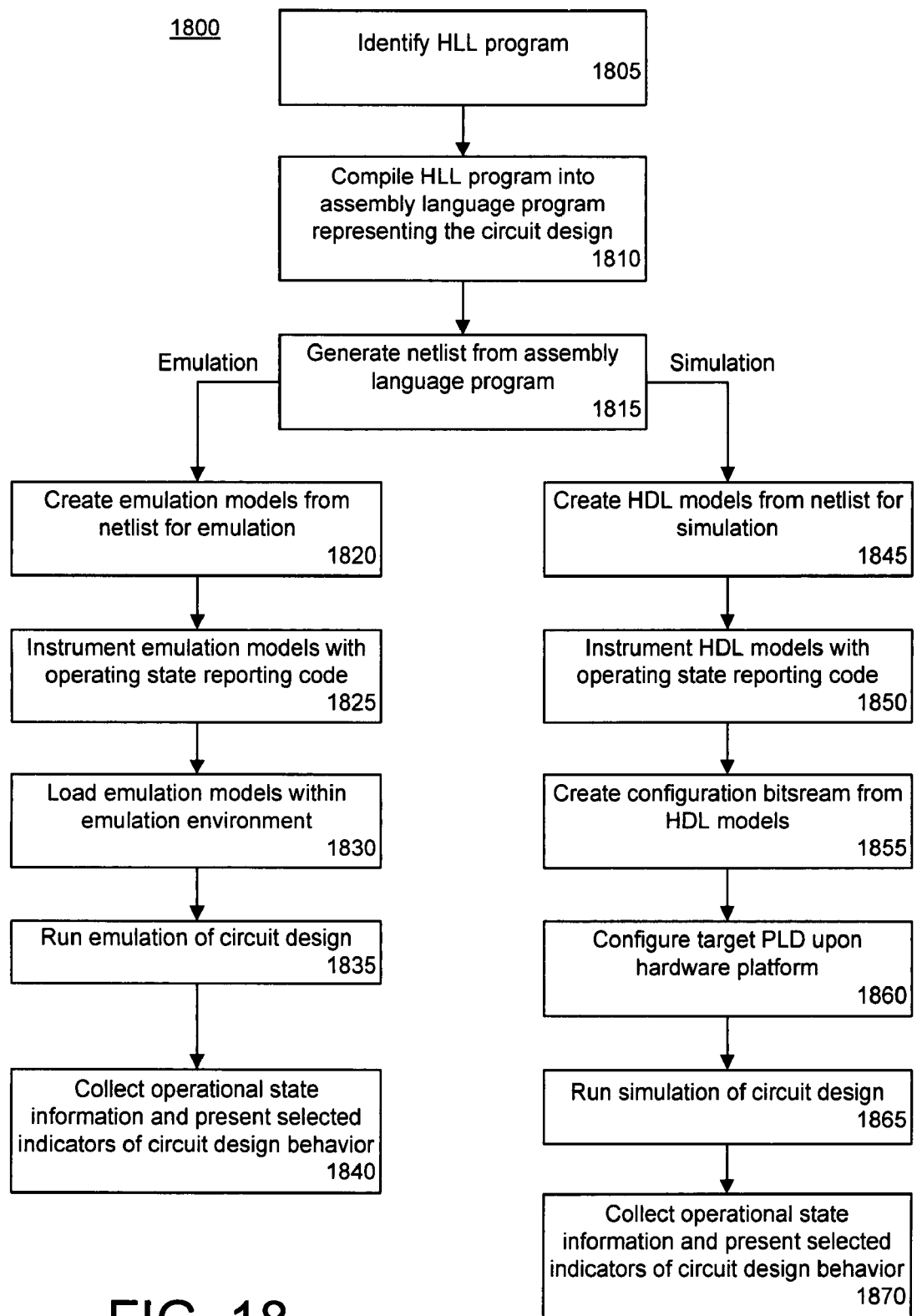
FIG. 18 is a flow chart illustrating a method of profiling a hardware system in accordance with another embodiment of the present invention.

FIG. 18 is a flow chart illustrating a method 1800 of profiling a hardware system in accordance with another embodiment of the present invention. The method 1800 can begin in step 1805 where an HLL program implementation of an algorithm to be implemented in hardware is identified. In step 1810, the HLL program can be compiled into an assembly language program. As noted, the assembly language program also can embody the algorithm to be implemented in hardware, i.e., translated into a circuit design. In one embodiment, the assembly language program can be implemented using the CHiMPS assembly language as described herein.

In step 1815, a netlist is generated from the assembly language program. If emulation is to be performed with respect to the circuit design, the method continues to step 1820, where emulation models are created from the netlist. In step 1825, the emulation models are instrumented with code that reports or provides operating state information pertaining to the model during emulation.

In step 1830, the emulation models is loaded into an emulation environment. In step 1835, the emulation of the circuit design can be run. In step 1840, the operational state information for the various models of the circuit design that are executing within the emulation environment is collected and/or stored. The information, as discussed herein, can be presented in various formats such that selected indicators of circuit design behavior can be visualized. This allows a designer to identify potential problems with the circuit design hardware, particularly in relation to pipelined architectures.

If simulation is to be performed, the method 1800 proceeds from step 1815 to step 1845, where HDL models for the circuit design can be created from the netlist. In step 1850, the HDL models are instrumented with code that instantiates operational state reporting structures, i.e., circuit elements, for the various components and/or modules within a target PLD.

In step 1855, a configuration bitstream is generated from the HDL models and in step 1860, the target PLD upon the hardware platform can be loaded with the configuration bitstream, thereby instantiating a version of the circuit design to be simulated. In step 1865, simulation of the circuit design can begin. As noted, the simulation can include the target PLD operating in coordination with a software-based simulator executing within a host computer system. Accordingly, in step 1870, the operational state of various modules or components within the target PLD as simulation continues are collected and/or stored. This information is sent from the hardware platform to the host computer system via a communication link. The operational state information is presented in any of a variety of different formats to indicate one or more selected indicators of circuit design behavior.

It should be appreciated that in yet another embodiment, the HDL models are used within a purely software-based testing environment in which no target PLD or hardware platform is used. In that case, the HDL models are instrumented with reporting code similar to the manner in which the emulation models are instrumented. The HDL models are executed within a simulation environment, for example a test bench, such that as the HDL models execute, one or more of the HDL models can report operating state information to the software simulator.

One or more of the block diagrams and/or flow charts illustrate the architecture, functionality, and operation of possible implementations of systems, methods, and computer program products according to various embodiments of the present invention. In this regard, each block may represent a module, segment, or portion of computer program, e.g., computer-usable program code, which can cause an information processing system to perform the functions described herein. The computer programs, or computer-usable program code, can be stored or embodied in any of a variety of computer program products. The computer program products can include computer-readable or computer-usable media such as optical media, magnetic media, computer memory, or the like.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising, i.e. open language. The term "coupled", as used herein, is defined as connected, although not necessarily directly, and not necessarily mechanically, i.e. communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. A method of profiling a hardware system comprising:
    compiling a high level language program into an assembly language representation of a hardware system, wherein the high level language program is specified using a language other than a hardware description language;
    translating instructions of the assembly language representation of the hardware system into a plurality of cycle-accurate, software-emulation models;
    wherein each software-emulation model corresponds to a respective one of the assembly language instructions, and the models are communicatively linked by FIFOs to form a pipelined architecture;
    instrumenting at least one of the plurality of models with code that, when executed, provides operating state information relating to the model as output;
    wherein the operating state information includes read state data, the at least one model is in a read state while the at least one model is waiting for data from another model to appear on an input FIFO to the at least one model, and the read state data indicates a number of consecutive cycles of an emulation the at least one model is in the read state; and
    indicating expected behavior of the hardware system by executing the models in an emulation environment on a computer system.

2. The method of claim 1, further comprising:
    identifying at least one model that is in a read state for at least two consecutive cycles of an emulation; and
    indicating that a component of the circuit represented by the identified model is available for sharing in performing another function during at least a portion of the time the at least one model is in the read state.

3. The method of claim 1, wherein compiling the high level language program further comprises:
    identifying constructs of the high level language program; and
    mapping the constructs to instructions and pseudo-instructions of the assembly language.

4. The method of claim 1, wherein translating instructions of the assembly language representation further comprises creating models of hardware components for the circuit design according to instructions of the assembly language.

5. The method of claim 4, wherein translating instructions of the assembly language representation further comprises creating models of first-in-first-outs that couple the models of hardware components for the hardware system according to operands of the instructions of the assembly language representation.

6. The method of claim 1, wherein indicating expected behavior further comprises indicating an operating state of at least one instrumented model during emulation.

7. The method of claim 1, wherein indicating expected behavior further comprises storing operational state information, generated during emulation, for at least one of the plurality of instrumented models.

8. A method of profiling a hardware system comprising:
    compiling a high level language program into an assembly language representation of a hardware system, wherein the high level language program is specified using a language other than a hardware description language;
    translating instructions of the assembly language representation of the hardware system into a plurality of hardware description language (HDL) models;
    wherein each HDL model corresponds to a respective one of the assembly language instructions, and the models are communicatively linked by FIFOs to form a pipelined architecture;
    instrumenting at least one of the plurality of HDL models with code that, when implemented within a programmable logic device, instantiates hardware structure that provides operating state information for a component corresponding to the instrumented HDL model;
    wherein the operating state information includes read state data, the at least one model is in a read state while the at least one model is waiting for data from another model to appear on an input FIFO to the at least one model, and the read state data indicates a number of consecutive cycles of a simulation the at least one model is in the read state; and
    indicating expected behavior of the hardware system by configuring the programmable logic device using the instrumented HDL models and running a simulation with the programmable logic device.

9. The method of claim 8, further comprising
    identifying at least one component instantiated by an instrumented HDL model that is in a read state for at least two consecutive cycles of a simulation; and
    indicating that the component of the hardware system is available for sharing in performing another function during at least a portion of the time the at least one model is in the read state.

10. The method of claim 9, wherein compiling the high level language representation further comprises:
    identifying constructs of the high level language representation; and
    mapping the constructs to instructions and pseudo-instructions of the assembly language.

11. The method of claim 8, wherein translating instructions of the assembly language representation further comprises creating HDL models of hardware components for the hardware system according to instructions of the assembly language.

12. The method of claim 11, wherein translating instructions of the assembly language representation further comprises creating HDL models of first-in-first-outs that link the HDL models of hardware components for the hardware system according to operands of the instructions of the assembly language representation.

13. The method of claim 8, wherein indicating expected behavior further comprises, within a host computing system, receiving operating state information during simulation for at least one component that corresponds to an instrumented HDL model that is instantiated within the programmable logic device.

14. The method of claim 13, further comprising storing the operating state information within the host computing system.

15. A computer program product comprising:
a computer-usable medium having stored thereon computer-usable program code that profiles a hardware system, said computer program product including:
computer-usable program code that compiles a high level language program into an assembly language representation of a hardware system, wherein the high level language program is specified using a language other than a hardware description language;
computer-usable program code that translates instructions of an assembly language representation of the hardware system into a plurality of executable, software models;
wherein each software model corresponds to a respective one of the assembly language instructions, and the models are communicatively linked by FIFOs to form a pipelined architecture;
computer-usable program code that instruments at least one of the plurality of models with code that causes operational information relating to the model to be provided as output;
wherein the operating state information includes read state data, the at least one model is in a read state while the at least one model is waiting for data from another model to appear on an input FIFO to the at least one model, and the read state data indicates a number of consecutive cycles the at least one model is in the read state; and
computer-usable program code that indicates expected behavior of the circuit by executing the models.

16. The computer program product of claim 15, wherein the models are implemented using a high level modeling language for use with cycle accurate emulation, wherein the computer-usable program code that that translates instructions of the assembly language representation further comprises:
computer-usable program code that creates models of hardware components for the circuit design according to instructions of the assembly language; and
computer-usable program code that creates models of first-in-first-outs that couple the models of hardware components for the hardware system according to operands of the instructions of the assembly language representation.

17. The computer program product of claim 16, wherein the computer-usable program code that indicates expected behavior further comprises computer-usable program code that that indicates an operating state of at least one instrumented model during emulation.

18. The computer program product of claim 15, wherein the models are hardware description language (HDL) models implemented using an HDL, wherein the computer-usable program code that translates instructions of the assembly language representation further comprises:
computer-usable program code that creates HDL models of hardware components for the circuit design according to instructions of the assembly language; and
computer-usable program code that creates HDL models of first-in-first-outs that couple the HDL models of hardware components for the circuit design according to operands of the instructions of the assembly language representation.

19. The computer program product of claim 18, wherein the computer-usable program code that indicates expected behavior of the hardware system further comprises:
computer-usable program code that configures a programmable logic device within a simulation environment with the HDL models; and
computer-usable program code that runs the programmable logic device within the simulation environment after configuration.

20. The computer program product of claim 19, further comprising computer-usable program code that, within a host computing system, receives operating state information during simulation for at least one component instantiated within the programmable logic device from an instrumented HDL model.

* * * * *